(12) United States Patent
Jang et al.

(10) Patent No.: US 8,476,923 B2
(45) Date of Patent: Jul. 2, 2013

(54) IMPEDANCE CONTROL CIRCUIT AND INTEGRATED CIRCUIT CHIP INCLUDING THE SAME

(75) Inventors: Dong-Wook Jang, Gyeonggi-do (KR); Yong-Mi Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/334,022

(22) Filed: Dec. 21, 2011

(65) Prior Publication Data

US 2012/0217991 A1    Aug. 30, 2012

(30) Foreign Application Priority Data

Feb. 28, 2011    (KR) .................... 10-2011-0017666

(51) Int. Cl.
*H03K 17/16*    (2006.01)
(52) U.S. Cl.
USPC ............................................................ 326/30
(58) Field of Classification Search
USPC ............................................................ 326/30
See application file for complete search history.

(56) References Cited

U.S. PATENT DOCUMENTS 7,961,001 B1 *    6/2011    Ko .................................... 326/30

FOREIGN PATENT DOCUMENTS

| KR | 1020090022043 | 3/2009 |
| KR | 1020100109143 | 10/2010 |

OTHER PUBLICATIONS

Notice of Allowance issued by the Korean Intellectual Property Office on Jul. 29, 2012.

* cited by examiner

*Primary Examiner* — Thienvu Tran
(74) *Attorney, Agent, or Firm* — IP & T Group LLP

(57) ABSTRACT

A circuit, including a first impedance unit having an impedance value based on a first impedance code and configured to drive a first node coupled with a resistor with a first voltage, a first code generation unit configured to generate the first impedance code so that an impedance value of the first impedance unit and an impedance value of the resistor are at a ratio of X:Y, dummy impedance units that receive the first impedance code and drive a second node with the first voltage, a second impedance unit having an impedance value based on a second impedance code and configured to drive the second node with a second voltage, and a second code generation unit configured to generate the second impedance code so that an overall impedance value of the dummy impedance units and an impedance value of the second impedance unit are at a ratio of X:Y.

19 Claims, 4 Drawing Sheets

IMPEDANCE CONTROL CIRCUIT AND INTEGRATED CIRCUIT CHIP INCLUDING THE SAME

CROSS-REFERENCE TO RELATED APPLICATIONS

The present application claims priority of Korean Patent Application No. 10-2011-0017666, filed on Feb. 28, 2011, which is incorporated herein by reference in its entirety.

BACKGROUND

1. Field

Exemplary embodiments of the present invention relate to an impedance control circuit.

2. Description of the Related Art

Diverse semiconductor devices formed of integrated circuit chips such as a Central Processing Unit (CPU), a memory, and a gate array are integrated with a variety of electrical devices such as a personal computer (PC), a server, and a workstation. Most semiconductor devices are equipped with a reception circuit for receiving diverse signals through an input pad and an output circuit for outputting internal signals through an output pad.

As the operation speeds of electrical devices become faster, the swing width of signals interfaced between semiconductor devices decrease gradually to minimize the delay time taken for signals to transfer. The narrower the swing width of a signal is, the more the signal is affected by external noise. Also, signal reflection originating from impedance mismatch at an interface node may affect the interfaced signal. The impedance mismatch is caused by external noise, variation of power source voltage, a change in operation temperature, a change in a fabrication process, and the like. Data may not be transferred at a fast rate due to the impedance mismatch. Also, the impedance mismatch may distort data outputted from a data output end of a semiconductor device. Therefore, setup/hold failure and input-voltage level indecision may be frequently caused when the semiconductor device receives a distorted output signal through the semiconductor device input.

Particularly, a semiconductor device featuring a fast operation speed adopts an impedance matching circuit, which is referred to as an on-die termination, around a pad in an integrated circuit chip to address some of the above described issues in signal transfer. According to a conventional on-die termination scheme, a source termination is performed in an output circuit of a transferring part, and a parallel termination is performed in a termination circuit that is coupled in parallel to the reception circuit coupled with the input pad.

ZQ calibration refers to a process for generating an impedance code that is used to maintain an impedance value at a target value although there is a change in the conditions of process, voltage and temperature (PVT). A termination impedance value is controlled based on the impedance code that is generated as a result of the ZQ calibration. Generally, a pad coupled with a reference resistor, which becomes a reference of a calibration operation, is referred to as a ZQ pad. The reference resistor is commonly called an external resistor because it is coupled outside of a chip.

Hereafter, an impedance control circuit for generating an impedance code is described. The impedance control circuit is also referred to as a calibration circuit.

FIG. 1 is a schematic view of a conventional impedance control circuit.

As shown in FIG. 1, the impedance control circuit includes a pull-up impedance unit 110, a dummy impedance unit 120, a pull-down impedance unit 130, comparators 102 and 103, and counters 104 and 105.

More specifically, the comparator 102 compares the voltage of a calibration node ZQ with a reference voltage VREF and generates an up signal UP or a down signal DN based on the comparison result. The voltage of the calibration node ZQ is generated from voltage distribution of the pull-up impedance unit 110 and the external resistor 101 coupled with a calibration pad. The reference voltage VREF is usually set to VDD/2. Here, the external resistor 101 is assumed to be of approximately 240Ω.

The counter 104 generates a pull-up impedance code PCODE<0:N> in response to the up/down signal UP/DN. The pull-up impedance code PCODE<0:N> adjusts the impedance value of the pull-up impedance unit 110 by turning on or off the parallel resistors inside of the pull-up impedance unit 110. Here, the parallel resistors are designed to have impedance values according to binary weight. The adjusted impedance value of the pull-up impedance unit 110 affects the voltage of the calibration node ZQ, and the above-described operation is repeated. The calibration operation repeats until the overall impedance value of the pull-up impedance unit 110 becomes the same as the impedance value of the external resistor 101. This is referred to as pull-up calibration.

The pull-up impedance code PCODE<0:N> is inputted to the dummy impedance unit 120 to decide the impedance value of the dummy impedance unit 120. From this point, a pull-down calibration operation begins. Just as the pull-up calibration operation, a calibration operation is performed using the comparator 103 and the counter 105 until the voltage of a node A becomes the same as the reference voltage VREF. This is referred to as pull-down calibration.

When the calibration operation is terminated, the pull-up impedance code PCODE<0:N>, which makes the external resistor 101 and the pull-up impedance unit 110 have the same impedance value, is generated, and a pull-down impedance code NCODE<0:N>, which makes the dummy impedance unit 120 and the pull-down impedance unit 130 have the same impedance value, is generated. The pull-up impedance code PCODE<0:N> and the pull-down impedance code NCODE<0:N> that are generated in the impedance control circuit are transferred to a termination circuit. The termination circuit terminates an interface code to adjust the impedance value of the termination circuit.

Referring to FIG. 1, the impedance value of the external resistor 101 is approximately 240Ω, and the target impedance values of the pull-up impedance unit 110 and the pull-down impedance unit 130 are approximately 240Ω too. In other words, the impedance value of the external resistor 101 and the target impedance values of the pull-up impedance unit 110 and the pull-down impedance unit 130 are the same.

However, there is a possibility that the calibration node ZQ may be coupled with an external resistor 101 having a different impedance value from the target impedance values of the pull-up impedance unit 110 and the pull-down impedance unit 130. For example, the target impedance values of the pull-up impedance unit 110 and the pull-down impedance unit 130 are approximately 240Ω, but the calibration node ZQ may be coupled with an external resistor 101 having a resistance of approximately 960Ω. Therefore, a method to generate accurate pull-up impedance code PCODE<0:N> and accurate pull-down impedance code NCODE<0:N> even though the external resistor 101 has a different impedance value from the target impedance values of the pull-up impedance unit 110 and the pull-down impedance unit 130 is desired.

SUMMARY

An embodiment of the present invention is directed to an impedance control circuit that may generate accurate impedance codes even through the impedance value of an external resistor coupled with the impedance control circuit is different from the target impedance values of a pull-up impedance unit and a pull-down impedance unit.

In accordance with an embodiment of the present invention, an impedance control circuit includes: a first impedance unit having an impedance value based on a first impedance code and configured to drive a first node coupled with an resistor outside of the integrated circuit chip with a first voltage; a first code generation unit configured to generate the first impedance code so that an impedance value of the first impedance unit and an impedance value of the resistor outside of the integrated circuit chip are at a ratio of X:Y, where X and Y are different numbers; a plurality of dummy impedance units that receive the first impedance code and drive a second node with the first voltage level; a second impedance unit having an impedance value based on a second impedance code and configured to drive the second node with a second voltage; and a second code generation unit configured to generate the second impedance code so that an overall impedance value of the dummy impedance units and an impedance value of the second impedance unit are at a ratio of X:Y.

The ratio of X:Y may be a ratio of a target impedance value of the first impedance unit to an impedance value of the resistor outside of the integrated circuit chip. The number of the dummy impedance units may be Y/X.

In accordance with another embodiment of the present invention, an integrated circuit chip includes: a first impedance unit having an impedance value based on a first impedance code and configured to drive a first node coupled with an resistor outside of the integrated circuit chip with a first voltage; a first code generation unit configured to generate the first impedance code so that an impedance value of the first impedance unit and an impedance value of the resistor outside of the integrated circuit chip are at a ratio of X:Y, where X and Y are different numbers; a plurality of dummy impedance units that receive the first impedance code and drive a second node with the first voltage; a second impedance unit having an impedance value based on a second impedance code and configured to drive the second node with a second voltage; a second code generation unit configured to generate the second impedance code so that an overall impedance value of the dummy impedance units and an impedance value of the second impedance unit are at a ratio of X:Y; a first termination unit having an impedance value based on the first impedance code and configured to drive an interface node with the first voltage; and a second termination unit having an impedance value based on the second impedance code and configured to drive an interface node with the second voltage.

The ratio of X:Y may be a ratio of a target impedance value of the first impedance unit to an impedance value of the resistor outside of the integrated circuit chip. The number of the dummy impedance units may be Y/X.

In accordance with yet another embodiment of the present invention, an impedance control circuit includes: a first impedance unit having an impedance value based on a first impedance code and configured to drive a first node coupled with an resistor outside of the integrated circuit chip with a first voltage; a first code generation unit configured to generate the first impedance code so that an impedance value of the first impedance unit and an impedance value of the resistor outside of the integrated circuit chip are at a ratio of X:Y, where X and Y are different numbers; a dummy impedance unit having an impedance value based on the first impedance code, where the impedance value is {(impedance value of the first impedance unit)*(X/Y)} and configured to drive a second node with the first voltage; a second impedance unit having an impedance value based on a second impedance code and configured to drive the second node with a second voltage; and a second code generation unit configured to generate the second impedance code so that an impedance value of the dummy impedance unit and an impedance value of the second impedance unit are at a ratio of X:Y.

The first impedance unit may include: a plurality of first transistors that are turned on/off based on respective signals constituting the first impedance code; and a plurality of first resistors respectively coupled with the first transistors, and the dummy impedance unit may include: a plurality of second transistors that are turned on/off based on respective signals constituting the first impedance code; and a plurality of second resistors respectively coupled with the second transistors, the impedance value of the first resistors and the impedance value of the second resistors being at a ratio of X:Y.

DETAILED DESCRIPTION

Figure 1:
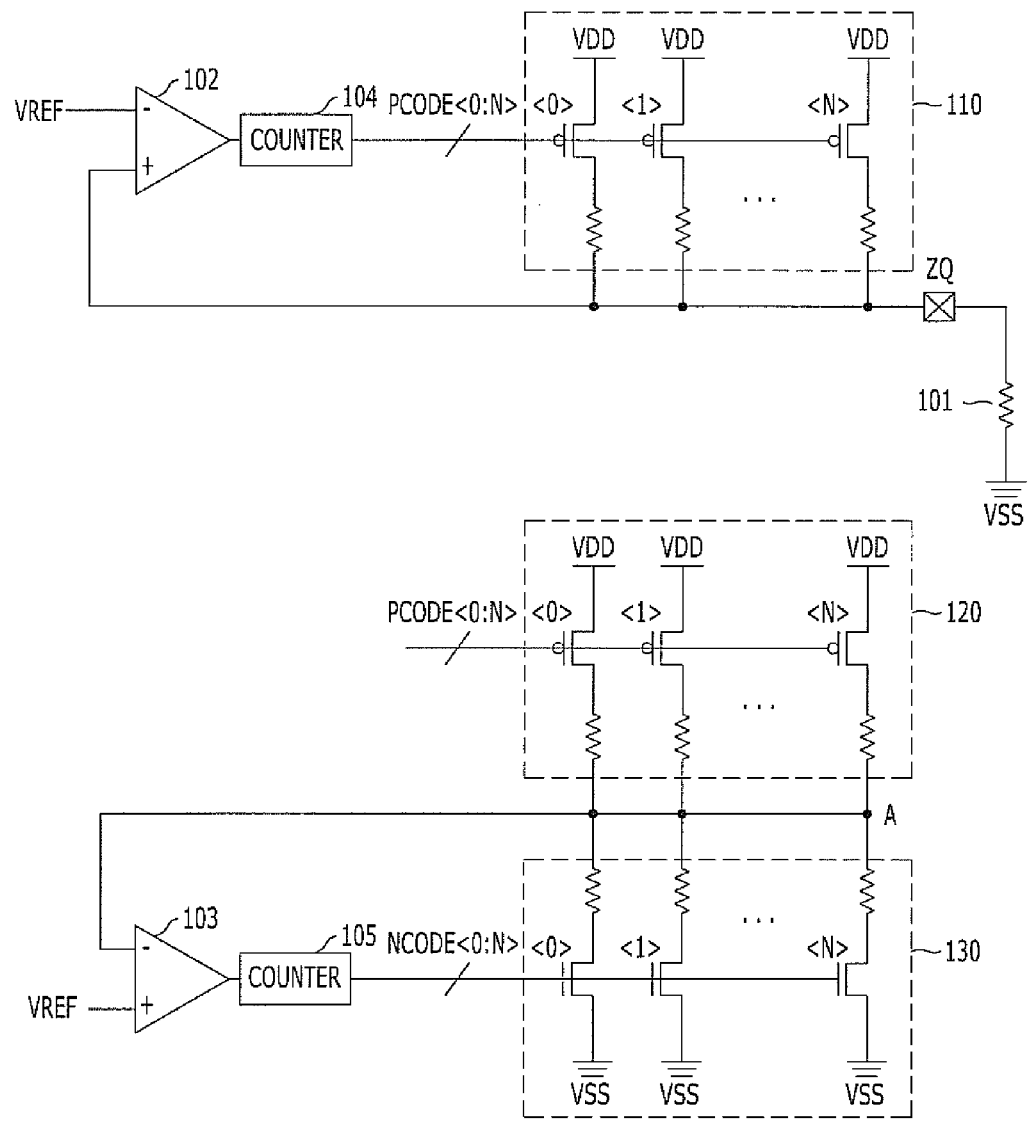
FIG. 1 is a schematic view of a conventional impedance control circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
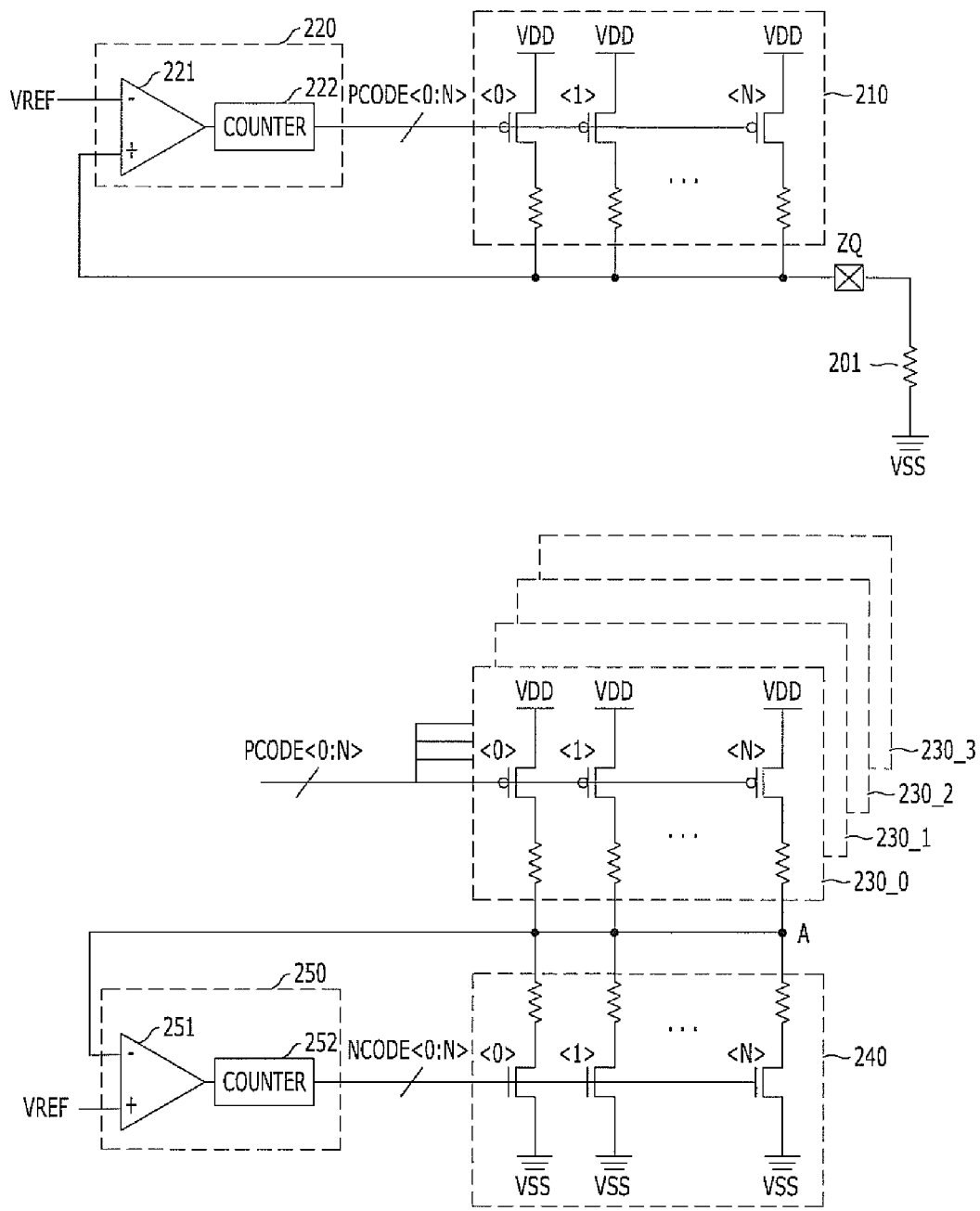
FIG. 2 is a schematic view of an impedance control circuit in accordance with an embodiment of the present invention.

FIG. 2 is a schematic view of an impedance control circuit in accordance with an embodiment of the present invention.

Referring to FIG. 2, the impedance control circuit includes a first impedance unit 210, a first code generation unit 220, a plurality of dummy impedance units 230_0 to 230_3, a second impedance unit 240, and a second code generation unit 250.

The technology of the present invention is directed to generating accurate impedance codes PCODE<0:N> and NCODE<0:N> when the target impedance values of the first impedance unit 210 and the second impedance unit 240 are different from the impedance value of an external resistor 201. Hereafter, it is assumed that the target impedance values of the first impedance unit 210 and the second impedance unit 240 are approximately 240Ω, and the impedance value of the external resistor 201 is approximately 960Ω. It is also assumed that a first voltage level is the voltage level of a power source voltage VDD, and a second voltage level is the voltage level of a ground voltage VSS.

The first impedance unit 210 has an impedance value based on a first impedance code PCODE<0:N>, and the first impedance unit 210 drives a first node ZQ coupled with the external resistor 201 with the first voltage level VDD. The first impedance unit 210 may include a plurality of transistors that are turned on or off based on the signals constituting the first impedance code PCODE<0:N>, respectively. The first impedance unit 210 also includes a plurality of resistors that are respectively coupled with the transistors.

The first code generation unit 220 generates the first impedance code PCODE<0:N>. The first impedance code PCODE<0:N> is generated to turn on an amount of the transistors in the first impedance unit 210 so that the impedance value of the first impedance unit 210 and the impedance value of the external resistor 201 are at a ratio of X:Y. The ratio of X:Y denotes the ratio of a target impedance value of the first impedance unit 210 to an impedance value of the external resistor 201. In this embodiment of the present invention, the ratio of X:Y is exemplified as 1:4. The first code generation unit 220 includes a comparator 221 and a counter 222. The comparator 221 compares the voltage level of the first node ZQ with the voltage level of a reference voltage VREF. The counter 222 generates the first impedance code PCODE<0:N> in response to the comparison result of the comparator 221. The reference voltage VREF is set to be VDD*{Y/(X+Y)} because the ratio of the impedance value of the first impedance unit 210 to the impedance value of the external resistor 201 is X:Y. In this embodiment of the present invention, the reference voltage is VDD*0.8.

Each of the dummy impedance units 230_0 to 230_3 has a similar structure as the first impedance unit 210. However, a second node A is driven with the first voltage level VDD instead of the first node ZQ. The number of the dummy impedance units 230_0 to 230_3 is Y/X, which is 4 in this embodiment of the present invention. The reason that the number of dummy impedance units is Y/X is because the ratio of the overall impedance value of the dummy impedance units 230_0 to 230_3 to the impedance value of the second impedance unit 240 is X:Y.

The second impedance unit 240 has an impedance value based on a second impedance code NCODE<0:N>, and the second impedance unit 240 drives the second node A with a second voltage level VSS. The second impedance unit 240 may include a plurality of transistors that are turned on or off based on the signals constituting the second impedance code NCODE<0:N>, respectively. The second impedance unit may further include a plurality of resistors that are respectively coupled with the transistors.

The second code generation unit 250 generates the second impedance code NCODE<0:N>. The second impedance code NCODE<0:N> is generated to turn on an amount of the transistors in the second impedance unit 240 so that the overall impedance value of the dummy impedance units 230_0 to 230_3 and the impedance value of the second impedance unit 240 are at the ratio of X:Y. The second code generation unit 250 includes a comparator 251 and a counter 252. The comparator 251 compares the voltage level of the second node A with the voltage level of a reference voltage VREF. The counter 252 generates the second impedance code NCODE<0:N> in response to the comparison result of the comparator 251.

More specifically, the first code generation unit 220 generates the first impedance code PCODE<0:N> in such a manner that the voltage level of the first node ZQ becomes the same as the voltage level of the reference voltage VREF. Therefore, the first impedance unit 210 receiving the first impedance code PCODE<0:N> has an impedance value of approximately 240Ω.

The first impedance code PCODE<0:N> is inputted to the dummy impedance units 230_0 to 230_3, and therefore, each of the dummy impedance units 230_0 to 230_3 has an impedance value of approximately 240Ω. Since the four dummy impedance units 230_0 to 230_3 are coupled in parallel to each other, the total impedance value of the dummy impedance units 230_0 to 230_3 results to approximately 60Ω. The second code generation unit 250 generates the second impedance code NCODE<0:N> in such a manner that the voltage level of the second node A becomes the same as the voltage level of the reference voltage VREF. Therefore, the second impedance unit 240 comes to have an impedance value of approximately 240Ω. Through the operation of the impedance control circuit, the first impedance code PCODE<0:N> and the second impedance code NCODE<0:N> are generated in such a manner that the first impedance unit 210 and the second impedance unit 240 have the target impedance value of approximately 240Ω. In short, although the impedance value of the external resistor 201 is different from the target impedance value of the first impedance unit 210 and the second impedance unit 240, accurate impedance codes PCODE<0:N> and NCODE<0:N> may be generated by controlling the voltage level of the reference voltage VREF and the number of the dummy impedance units 230_0 to 230_3.

The embodiment of FIG. 2 exemplifies an impedance control circuit where the first voltage level is the voltage level of a power source voltage VDD while the second voltage level is the voltage level of a ground voltage VSS, and the first impedance code is a pull-up impedance code PCODE<0:N> while the second impedance code is a pull-down impedance code NCODE<0:N>. Conversely, when the external resistor 201 is coupled with the first node ZQ, the first voltage level may be the voltage level of the ground voltage VSS while the second voltage level is the voltage level of the power source voltage VDD, and the first impedance code is a pull-down impedance code NCODE<0:N> while the second impedance code is a pull-up impedance code PCODE<0:N>.

Figure 3:
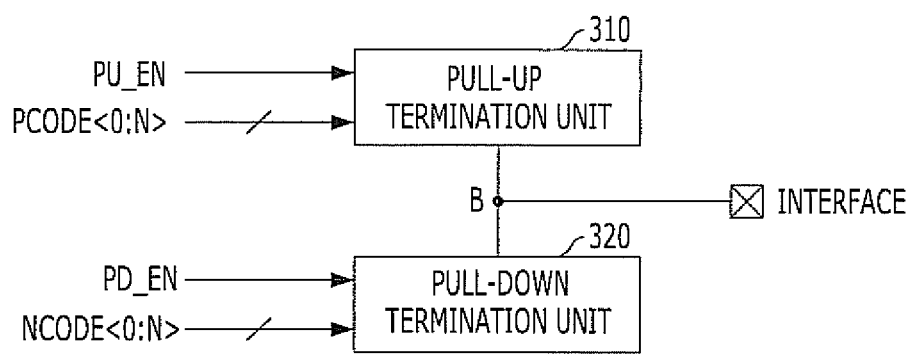
FIG. 3 illustrates a termination circuit for terminating an interface node based on impedance codes PCODE<0:N> and NCODE<0:N> that are generated in the impedance control circuit shown in FIG. 2.

FIG. 3 illustrates a termination circuit for terminating an interface node based on impedance codes PCODE<0:N> and NCODE<0:N> that are generated in the impedance control circuit shown in FIG. 2.

The interface node B is a node coupled with an interface pad INTERFACE through which data or signals are inputted/outputted. In an integrated circuit chip, a ZQ pad includes the impedance control circuit (refer to FIG. 2) and an interface pad includes the termination circuit (refer to FIG. 3).

The termination circuit includes a first termination unit 310 and a second termination unit 320. The first termination unit 310 receives a first impedance code PCODE<0:N> and has an impedance value based on the first impedance code PCODE<0:N>. As shown in FIG. 3, a PU_EN signal is inputted to the first termination unit 310. The PU_EN signal is a signal for enabling the first termination unit 310. In short, whether the first termination unit 310 is enabled or not is decided based on the PU_EN signal. When the first termination unit 310 is enabled, the first termination unit 310 has an impedance value based on the first impedance code PCODE<0:N>. The second termination unit 320 receives a second impedance code NCODE<0:N> and has an impedance value based on the second impedance code NCODE<0:N>. As shown in FIG. 3, a PD_EN signal is inputted to the second termination unit 320. The PD_EN signal is a signal for enabling the second termination unit 320. In short, whether the second termination unit 320 is enabled or not is decided based on the PD_EN signal. When the second termination unit 320 is enabled, the second termination unit 320 has an impedance value based on the second impedance code NCODE<0:N>.

Although FIG. 3 illustrates that the termination circuit includes one first termination unit 310 and one second termination unit 320, the termination circuit may include a plurality of first termination units 310 and a plurality of second termination units 320 according to the impedance value required for impedance matching. For example, if a pull-up impedance value and a pull-down impedance value have to be approximately 120Ω, individually, two first termination units 310 having an impedance value of approximately 240Ω are coupled with the interface node in parallel, and two second termination units 320 having an impedance value of approximately 240Ω are coupled with the interface node in parallel.

Here, the first termination unit 310 and the second termination unit 320 have an internal structure similar to that of the first impedance unit 210 and the second impedance unit 240, and the first termination unit 310 and the second termination unit 320 have almost the same impedance value as the first impedance unit 210 and the second impedance unit 240.

Figure 4:
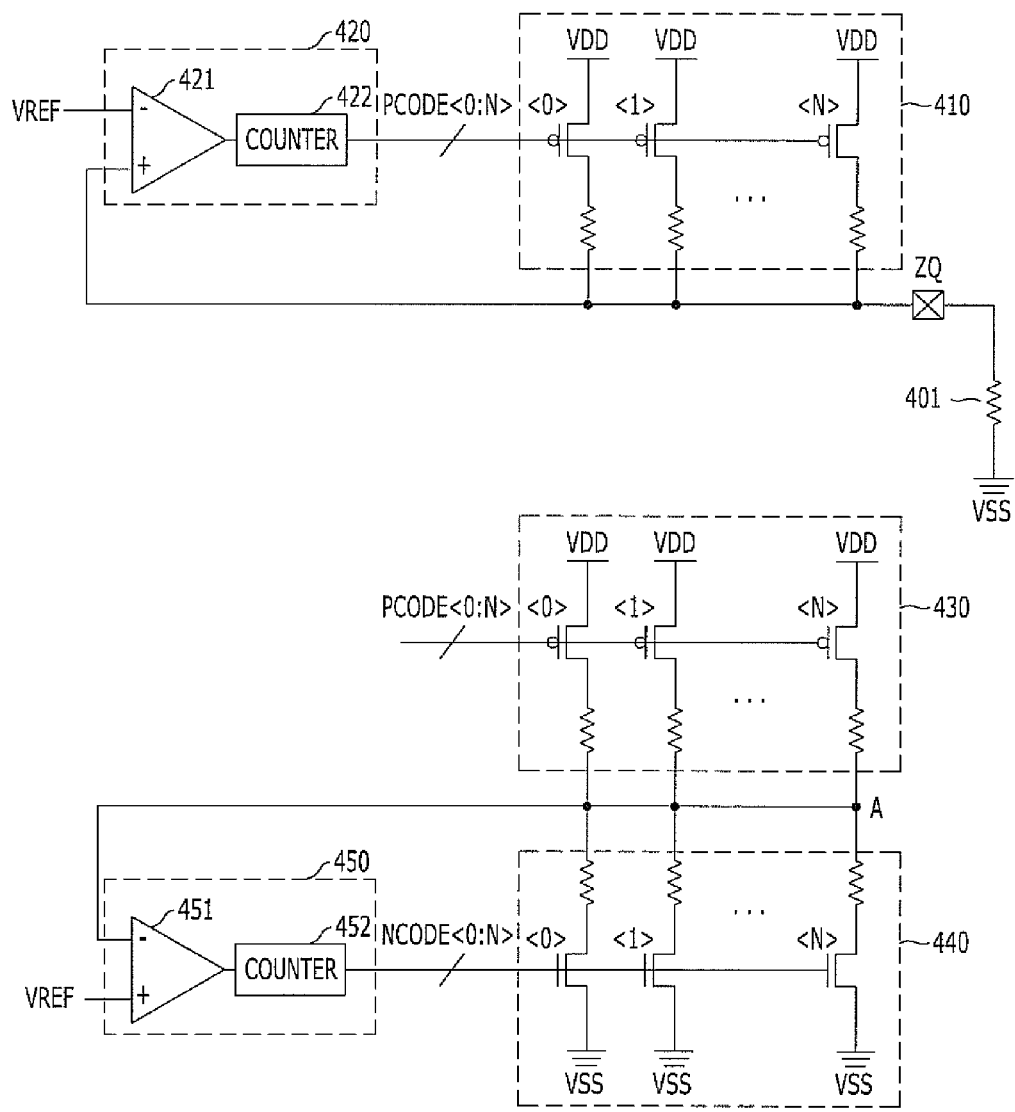
FIG. 4 is a schematic view of an impedance control circuit in accordance with another embodiment of the present invention.

FIG. 4 is a schematic view of an impedance control circuit in accordance with another embodiment of the present invention.

Referring to FIG. 4, the impedance control circuit includes a first impedance unit 410, a first code generation unit 420, a dummy impedance unit 430, a second impedance unit 440, and a second code generation unit 450. The first impedance unit 410 has an impedance value based on a first impedance code PCODE<0:N> and drives a first node ZQ coupled with an external resistor 401 with a first voltage level VDD. The first code generation unit 420 generates the first impedance code PCODE<0:N>. The first impedance code PCODE<0:N> is generated to turn on an amount of the transistors in the first impedance unit 410 so that an impedance value of the first impedance unit 410 and an impedance value of the external resistor 401 are at a ratio of X:Y, where X and Y are different numbers. The dummy impedance unit 430 has an impedance value based on the first impedance code PCODE<0:N> where the impedance value is {(impedance value of the first impedance unit 410)*(X/Y)} at the same code, and drives a second node A with the first voltage level VDD. The second impedance unit 440 has an impedance value based on a second impedance code NCODE<0:N> and drives a second node A with the second voltage level VSS. The second code generation unit 450 generates the second impedance code NCODE<0:N>. The second impedance code NCODE<0:N> is generated to turn on an amount of the transistors in the second impedance unit 440 so that an impedance value of the dummy impedance unit 430 and an impedance value of the second impedance unit 440 are at a ratio of X:Ys.

The difference between the embodiment of FIG. 4 and the embodiment of FIG. 2 lies in the number of the dummy impedance units 430. There is one dummy impedance unit 430 in the embodiment of FIG. 4. The dummy impedance unit 430 has the same structure as the first impedance unit 410 but has a different resistance value. In other words, when the first impedance code PCODE<0:N> is received, the dummy impedance unit 430 has an impedance value of {(impedance value of the first impedance unit 410)*(X/Y)}. For example, when it is assumed that X:Y is 1:4, the dummy impedance unit 430 has an impedance value of (impedance value of the first impedance unit 410)*¼.

To have a different impedance value in the dummy impedance unit 430, the internal resistors of the dummy impedance unit 430 have ¼ of the resistance value of the internal resistors of the first impedance unit 410. In the embodiment of FIG. 2, four dummy impedance units 230_0 to 230_3 are provided to make the overall impedance value of the dummy impedance units 230_0 to 230_3 become (the impedance value of the first impedance unit 210)*¼, whereas the internal resistors of the dummy impedance unit 430 have lower resistance values than the internal resistors of the first and second impedance units 410 and 440 so that the impedance value of the dummy impedance unit 430 becomes (the impedance value of the first impedance unit 410)*¼ in the embodiment of FIG. 4.

According to an embodiment of the present invention, an impedance control circuit may generate accurate impedance codes, even though the impedance value of an external resistor coupled with the impedance control circuit is different than the target impedance values of a pull-up impedance unit and a pull-down impedance unit.

While the present invention has been described with respect to the specific embodiments, it will be apparent to those skilled in the art that various changes and modifications may be made without departing from the spirit and scope of the invention as defined in the following claims.

What is claimed is:

1. An impedance control circuit, comprising:
 a first impedance unit having an impedance value based on a first impedance code and configured to drive a first node with a first voltage;
 a first code generation unit configured to generate the first impedance code so that an impedance value of the first impedance unit and an impedance value of a external resistor are at a ratio of X:Y, wherein X and Y are different numbers;
 a plurality of dummy impedance units that receive the first impedance code and drive a second node with the first voltage, wherein the number of the dummy impedance units is Y/X;
 a second impedance unit having an impedance value based on a second impedance code and configured to drive the second node with a second voltage; and
 a second code generation unit configured to generate the second impedance code so that an overall impedance value of the dummy impedance units and an impedance value of the second impedance unit are at a ratio of X:Y.

2. The impedance control circuit of claim 1, wherein the ratio of X:Y is a ratio of a target impedance value of the first impedance unit to an impedance value of the resistor.

3. The impedance control circuit of claim 1, wherein each of the dummy impedance units has the same structure as the first impedance unit.

4. The impedance control circuit of claim 1, wherein the target impedance value of the first impedance unit is the same as a target impedance value of the second impedance unit.

5. The impedance control circuit of claim 1, wherein the first impedance unit comprises:
 a plurality of first transistors configured to turned on/off based on respective signals constituting the first impedance code; and
 a plurality of first resistors respectively coupled with the first transistors; and
 the second impedance unit comprises:
 a plurality of second transistors configured to turned on/off based on respective signals constituting the second impedance code; and
 a plurality of second resistors respectively coupled with the second transistors.

6. The impedance control circuit of claim 1, wherein the first code generation unit comprises,
- a first comparator for comparing a voltage of the first node with a voltage of a reference voltage; and
- a first counter for generating the first impedance code in response to a comparison result of the first comparator; and the second code generation unit comprises,
- a second comparator for comparing a voltage of the second node with a voltage of the reference voltage; and
- a second counter for generating the second impedance code in response to a comparison result of the second comparator.

7. The impedance control circuit of claim 6, wherein the reference voltage has a voltage of a power source voltage* (Y/(X+Y)).

8. The impedance control circuit of claim 1, wherein the first voltage has a voltage of the power source voltage, and the second voltage has a voltage of a ground voltage.

9. The impedance control circuit of claim 1, wherein the plurality of dummy impedance units has the same structure as the first impedance unit.

10. An integrated circuit chip, comprising:
- a first impedance unit having an impedance value based on a first impedance code and configured to drive a first node coupled with a resistor with a first voltage;
- a first code generation unit configured to generate the first impedance code so that an impedance value of the first impedance unit and an impedance value of the resistor are at a ratio of X:Y, where X and Y are different numbers;
- a plurality of dummy impedance units that receive the first impedance code and drive a second node with the first voltage, wherein the number of the dummy impedance units is Y/X;
- a second impedance unit having an impedance value based on a second impedance code and configured to drive the second node with a second voltage;
- a second code generation unit configured to generate the second impedance code so that an overall impedance value of the dummy impedance units and an impedance value of the second impedance unit are at a ratio of X:Y;
- a first termination unit having an impedance value based on the first impedance code and configured to drive an interface node with the first voltage; and
- a second termination unit having an impedance value based on the second impedance code and configured to drive an interface node with the second voltage.

11. The integrated circuit chip of claim 10, wherein the ratio of X:Y is a ratio of a target impedance value of the first impedance unit to an impedance value of the resistor.

12. The integrated circuit chip of claim 10, wherein the target impedance value of the first impedance unit is the same as a target impedance value of the second impedance unit.

13. The integrated circuit chip of claim 10, wherein the first termination unit and the second termination unit are provided in plural, and the number of the first termination units and the number of the second termination units are decided based on an termination impedance value of the integrated circuit chip.

14. The integrated circuit chip of claim 10, wherein each of the plurality of dummy impedance units has the same structure as the first impedance unit.

15. The integrated circuit chip of claim 10, wherein the first termination unit has an impedance value based on the first impedance code when a first enable signal is enabled, and the second termination unit has an impedance value based on a second impedance code when a second enable signal is enabled.

16. An impedance control circuit, comprising:
- a first impedance unit having an impedance value based on a first impedance code and configured to drive a first node coupled with a resistor with a first voltage;
- a first code generation unit configured to generate the first impedance code so that an impedance value of the first impedance unit and an impedance value of the resistor are at a ratio of X:Y, where X and Y are different numbers;
- a dummy impedance unit having an impedance value based on the first impedance code, where the impedance value is ((impedance value of the first impedance unit)*(X/Y)) and configured to drive a second node with the first voltage;
- a second impedance unit having an impedance value based on a second impedance code and configured to drive the second node with a second voltage; and
- a second code generation unit configured to generate the second impedance code so that an impedance value of the dummy impedance unit and an impedance value of the second impedance unit are at a ratio of X:Y.

17. The impedance control circuit of claim 16, wherein the ratio of X:Y is a ratio of a target impedance value of the first impedance unit to an impedance value of the resistor.

18. The impedance control circuit of claim 17, wherein the target impedance value of the first impedance unit is the same as a target impedance value of the second impedance unit.

19. The impedance control circuit of claim 16, wherein the first impedance unit comprises,
- a plurality of first transistors configured to turned on/off based on respective signals constituting the first impedance code; and
- a plurality of first resistors respectively coupled with the first transistors; and the dummy impedance unit comprises,
- a plurality of second transistors configured to turned on/off based on respective signals constituting the first impedance code; and
- a plurality of second resistors respectively coupled with the second transistors, the impedance value of the first resistors and the impedance value of the second resistors are at a ratio of X:Y.

* * * * *